US009250284B1

(12) United States Patent
Yang et al.

(10) Patent No.: US 9,250,284 B1
(45) Date of Patent: Feb. 2, 2016

(54) LEVEL SHIFT CIRCUIT WITH SHORT-CIRCUIT DETECTION MECHANISM AND SHORT-CIRCUIT DETECTION METHOD THEREOF

(71) Applicant: AU OPTRONICS CORP., Hsin-Chu (TW)

(72) Inventors: Jin-Jang Yang, Hsin-Chu (TW); Ching-Hung Wang, Hsin-Chu (TW); Huang-Ti Lin, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/546,605

(22) Filed: Nov. 18, 2014

(30) Foreign Application Priority Data

Aug. 19, 2014 (TW) .............................. 103128508 A

(51) Int. Cl.
| H03L 5/00 | (2006.01) |
| G01R 31/02 | (2006.01) |
| H03K 19/0185 | (2006.01) |
| H03K 3/356 | (2006.01) |

(52) U.S. Cl.
CPC ........ *G01R 31/025* (2013.01); *H03K 3/356104* (2013.01); *H03K 19/018521* (2013.01)

(58) Field of Classification Search
None
See application file for complete search history.

(56) References Cited

U.S. PATENT DOCUMENTS

| 8,232,941 | B2 * | 7/2012 | Yeo ...................... G09G 3/3677 345/100 |
| 8,994,401 | B2 * | 3/2015 | Hatakeyama ...... H03K 19/0027 326/63 |
| 2011/0133836 | A1 | 6/2011 | Yu et al. | |
| 2011/0181525 | A1 | 7/2011 | Hsieh et al. | |
| 2014/0002144 | A1 * | 1/2014 | Hatakeyama ...... H03K 19/0027 327/108 |

FOREIGN PATENT DOCUMENTS

TW              591841          6/2004

* cited by examiner

*Primary Examiner* — Long Nguyen
(74) *Attorney, Agent, or Firm* — WPAT, PC; Justin King

(57) ABSTRACT

A level shift circuit includes a level shift module and a voltage comparing module. The level shift module includes a plurality of stages of level shift units, each including a front-end circuit and an inverter circuit. The inverter circuit is electrically coupled to the front-end circuit and receives and inverts an output signal of the front-end circuit. The front-end circuit receives a clock signal, converts high/low voltage level of the clock signal into first/second voltage level, respectively, and outputs a respective signal with the first/second voltage level. The voltage comparing module is coupled to the level shift module and receives output signals of the inverter circuit of the first level shift unit and of the front-end circuit in the second level shift unit and compares the two output signals. The voltage comparing module outputs a short-circuit protection trigger signal when the two output signals have different voltages.

18 Claims, 6 Drawing Sheets

LEVEL SHIFT CIRCUIT WITH SHORT-CIRCUIT DETECTION MECHANISM AND SHORT-CIRCUIT DETECTION METHOD THEREOF

TECHNICAL FIELD

The present disclosure relates to a level shift circuit and a detection method, and more particularly to a level shift circuit with short-circuit detection mechanism and a short-circuit detection method.

BACKGROUND

Generally, the display apparatus adopting gate on array (GOA) technology can be divided into two parts, which are the external circuit board and the display panel. The external circuit board is disposed with a timing controller and a level shift circuit. The display panel includes a plurality of pixels and is disposed with a plurality of source lines, a plurality of gate lines and a gate driver circuit comprising a plurality of shift registers which are directly formed the substrate of the display panel. The timing controller is configured to provide a plurality of clock signals to the level shift circuit; and the level shift circuit is configured to convert high and low voltage levels of the received clock signals into another high and low voltage levels and transmit the converted clock signals to the gate driver circuit through the wires on the display panel. Thus, the gate driver circuit can generate gate pulses according to the converted clock signals.

However, if dust particles are fallen on these wires during the display panel manufacturing or assembly processes, a short-circuit issue may occur while the converted clock signals are being transmitted from the level shift circuit to the gate driver circuit. As a result, the circuit components in the display apparatus may be damaged by the short-circuit issue.

SUMMARY

Therefore, an aspect of the present disclosure is to provide a level shift circuit with short-circuit detection mechanism.

Another aspect of the present disclosure is to provide a short-circuit detection method adapted to be used in the aforementioned level shift circuit with short-circuit detection mechanism.

The present disclosure provides a level shift circuit with short-circuit detection mechanism, which includes a level shift module and a voltage comparing module. The level shift module includes a plurality of stages of level shift units. Each level shift unit includes a front-end circuit and an inverter circuit. Each inverter circuit is electrically coupled to the respective front-end circuit and configured to receive and invert an output signal of the respective front-end circuit. Each front-end circuit is configured to receive a respective clock signal, convert a high voltage level and a low voltage level of the received respective clock signal into a first voltage level and a second voltage level, respectively, and output a converted clock signal with the first voltage level and the second voltage level according to the respective clock signal. The voltage comparing module is electrically coupled to the level shift module and configured to receive an output signal of the inverter circuit in a first level shift unit among the plurality of level shift units and an output signal of the front-end circuit of a second level shift unit among the plurality of level shift units and compare the two received output signals. The voltage comparing module is further configured to output a short-circuit protection trigger signal when the two received output signals have substantially different voltages.

The present disclosure further provides a short-circuit detection method adapted to be used in a display apparatus including the aforementioned level shift module. The short-circuit detection method includes steps of: comparing a voltage of the output signal of the inverter circuit in a first level shift unit in the plurality of level shift units and a voltage of the output signal of the front-end circuit in a second level shift unit in the plurality of level shift units; and providing a short-circuit protection trigger signal when it is determined that the two output signals have different voltages.

BRIEF DESCRIPTION OF THE DRAWINGS

The present disclosure will become more readily apparent to those ordinarily skilled in the art after reviewing the following detailed description and accompanying drawings, in which:

FIG. 4-1 is a timing chart of the signals related to the level shift circuit of FIG. 3 in accordance with an embodiment of the present disclosure;

FIG. 4-2 is a timing chart of the signals related to the level shift circuit of FIG. 3 in accordance with another embodiment of the present disclosure.

DETAILED DESCRIPTION OF PREFERRED EMBODIMENTS

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
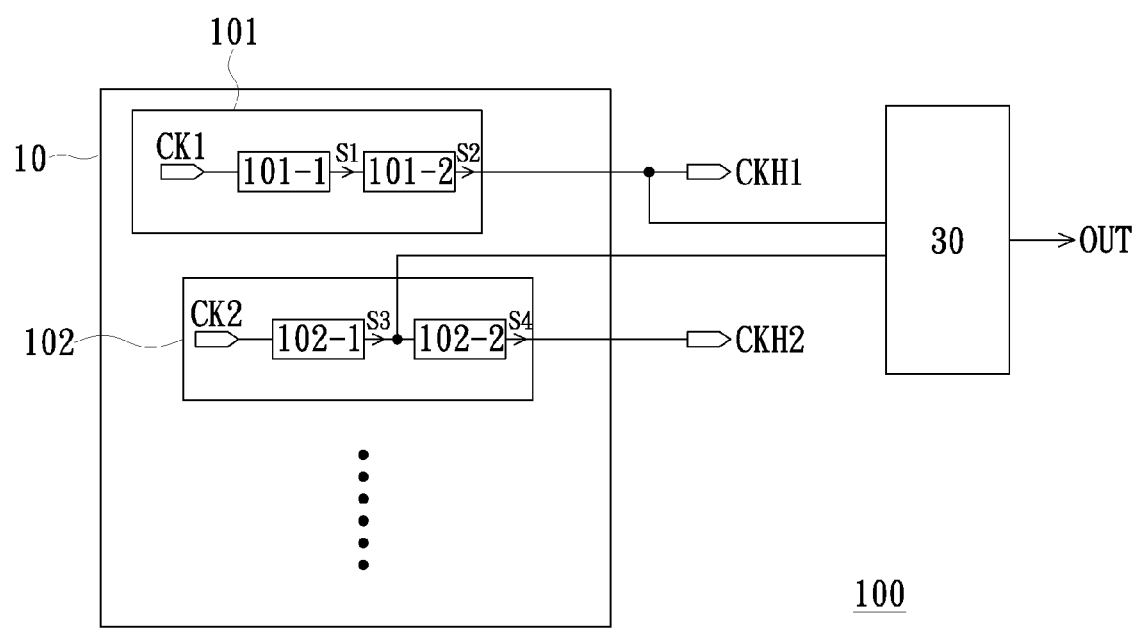
FIG. 1 is a circuit block view of a level shift circuit with short-circuit detection mechanism in accordance with an embodiment of the present disclosure.

FIG. 1 is a circuit block view of a level shift circuit with short-circuit detection mechanism in accordance with an embodiment of the present disclosure. As shown, the level shift circuit 100 in the present embodiment includes a level shift module 10 and a voltage comparing module 30. The level shift module 10 includes a plurality of stages of level shift units. To facilitate a better understanding of the present disclosure, it is to be noted that the level shift module 10 in the present embodiment is exemplified by including two level shift units 101, 102 only. The level shift unit 101 includes a front-end circuit 101-1 and an inverter circuit 101-2. The level shift unit 102 includes a front-end circuit 102-1 and an inverter circuit 102-2. The front-end circuit 101-1 is configured to receive a clock signal CK1, convert high and low voltage levels of the received clock signal CK1 into voltage levels VGH and VGL, respectively, and then output a converted clock signal with the voltage levels VGH and VGL. The front-end circuit 102-1 is configured to receive a clock signal CK2, convert high and low voltage levels of the received clock signal CK2 into voltage levels VGH and VGL, respectively, and then output a converted clock signal with the voltage levels VGH and VGL.

The pulse enable periods of the clock signals CK1, CK2 may not overlap. The inverter circuit 101-2 is electrically coupled to the front-end circuit 101-1. The inverter circuit 101-2 is configured to receive the output signal S1 from the front-end circuit 101-1, invert the received output signal S1 and accordingly output the inverted output signal S2 through an output terminal CKH1 of the level shift unit 101. The inverter circuit 102-2 is electrically coupled to the front-end circuit 102-1. The inverter circuit 102-2 is configured to receive the output signal S3 from the front-end circuit 102-1, invert the received output signal S3 and accordingly output the inverted output signal S4 through an output terminal CKH2 of the level shift unit 102. The two inverted output signal S2, S4 are transmitted to a gate driver circuit (not shown) through two respective wires (not shown) on a display panel (not shown).

The voltage comparing module 30 is electrically coupled to the level shift module 10 and configured to receive the output signal S2 from the inverter circuit 101-2 in the level shift unit 101, receive the output signal S3 from the front-end circuit 102-1 in the level shift unit 102, and compare the voltages of the two received output signals S2, S3. In addition, the voltage comparing module 30 is further configured to output a short-circuit protection trigger signal OUT to a specific circuit in a rear-end circuit (not shown) when determining that the two output signals S2, S3 have substantially different voltages; wherein the specific circuit in the rear-end circuit is configured to execute a short-circuit protection according to the short-circuit protection trigger signal OUT.

As described above, the pulse enable periods of the clock signals CK1, CK2 may not overlap. Therefore, under a normal circumstance, the voltage of the output signal S2 from the inverter circuit 101-2 in the level shift unit 101 is equal (or substantially equal) to the voltage of the output signal S3 from the front-end circuit 102-1 in the level shift unit 102 when the clock signal CK1 (or the clock signal CK2) has a high voltage level H. On the contrary, the voltage of the output signal S2 from the inverter circuit 101-2 in the level shift unit 101 is different (or substantially different) with the voltage of the output signal S3 from the front-end circuit 102-1 in the level shift unit 102 when the output terminals CKH1, CKH2 (or the wires electrically coupled to the output terminals CKH1, CKH2) have a short circuit.

The aforementioned conclusion is based on that the voltages of the output signals S2, S4 respectively outputted from the inverter circuits 101-2, 102-2 will be affected by a short circuit related to the output terminals CKH1, CKH2 but the voltages of the output signals S1, S3 respectively outputted from the front-end circuits 101-1, 102-1 will not be affected by the short circuit. In other words, it is determined that a short circuit happens when the voltage comparing module 30 indicates that the output signals S2, S3 have different voltages; and accordingly the voltage comparing module 30 outputs the short-circuit protection trigger signal OUT to inform the specific circuit in the rear-end circuit to execute a short-circuit protection.

In one embodiment, the level shift unit 102 is one stage after the level shift unit 101; in other words, the level shift unit 102 is adjacent to the level shift unit 101 and configured to have its inverter circuit 102-2 for outputting the output signal S4 after the inverter circuit 101-2 in the level shift unit 101 outputting the output signal S2. In another embodiment, the level shift unit 102 is one stage before the level shift unit 101; in other words, the level shift unit 102 is adjacent to the level shift unit 101 and configured to have its inverter circuit 102-2 for outputting the output signal S4 before the inverter circuit 101-2 in the level shift unit 101 outputting the output signal S2.

In addition, in response to a specific display requirement (for example, a three-dimensional (3D) display), it is understood that the level shift unit 102 is at least two stages after the level shift unit 101 or the level shift unit 102 is at least two stages before the level shift unit 101 due to one clock signal is supplied to two adjacent level shift units. In addition, if the level shift unit 102 is two stages after the level shift unit 101, it is understood that one specific level shift unit is disposed between the level shift units 101, 102; wherein this specific level shift unit is configured to have its inverter circuit for outputting the output signal after the inverter circuit 101-2 in the level shift unit 101 outputting the output signal S2 but before the inverter circuit 102-2 in the level shift unit 102 outputting the output signal S4. Similarly, if the level shift unit 102 is two stages before the level shift unit 101, it is understood that one specific level shift unit is disposed between the level shift units 101, 102; wherein this specific level shift unit is configured to have its inverter circuit for outputting the output signal after the inverter circuit 102-2 in the level shift unit 102 outputting the output signal S4 but before the inverter circuit 101-2 in the level shift unit 101 outputting the output signal S2.

Figure 2:
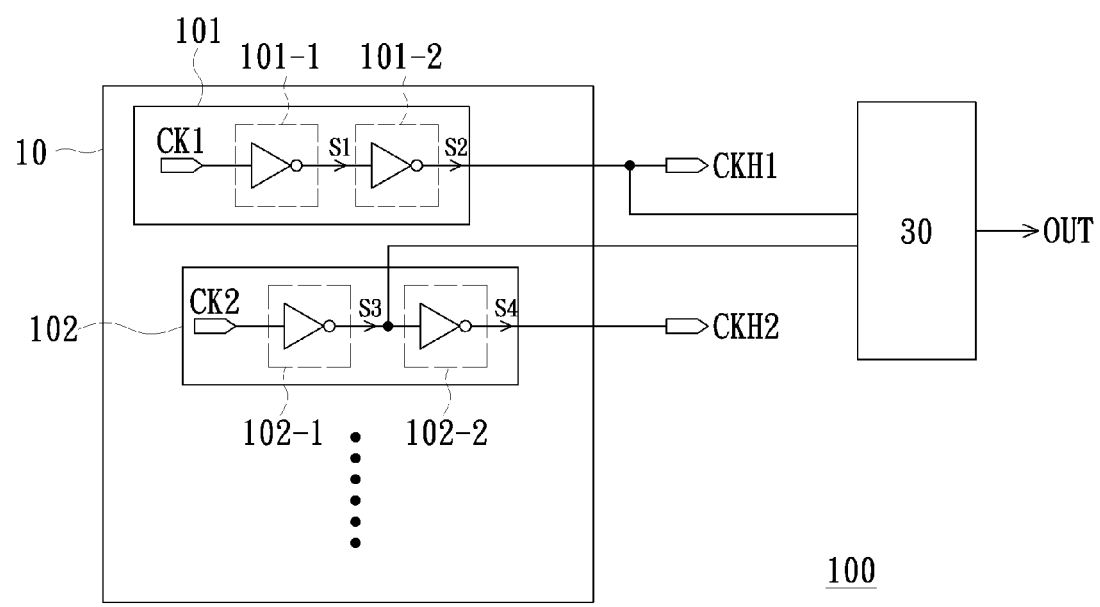
FIG. 2 is a circuit block view of an exemplary implementation of the level shift circuit of FIG. 1 in accordance with an embodiment of the present disclosure.

FIG. 2 is a circuit block view of an exemplary implementation of the level shift circuit of FIG. 1 in accordance with an embodiment of the present disclosure. As shown, all of the front-end circuits 101-1, 102-1 and the inverter circuits 101-2, 102-2 are implemented with inverters.

Figure 3:
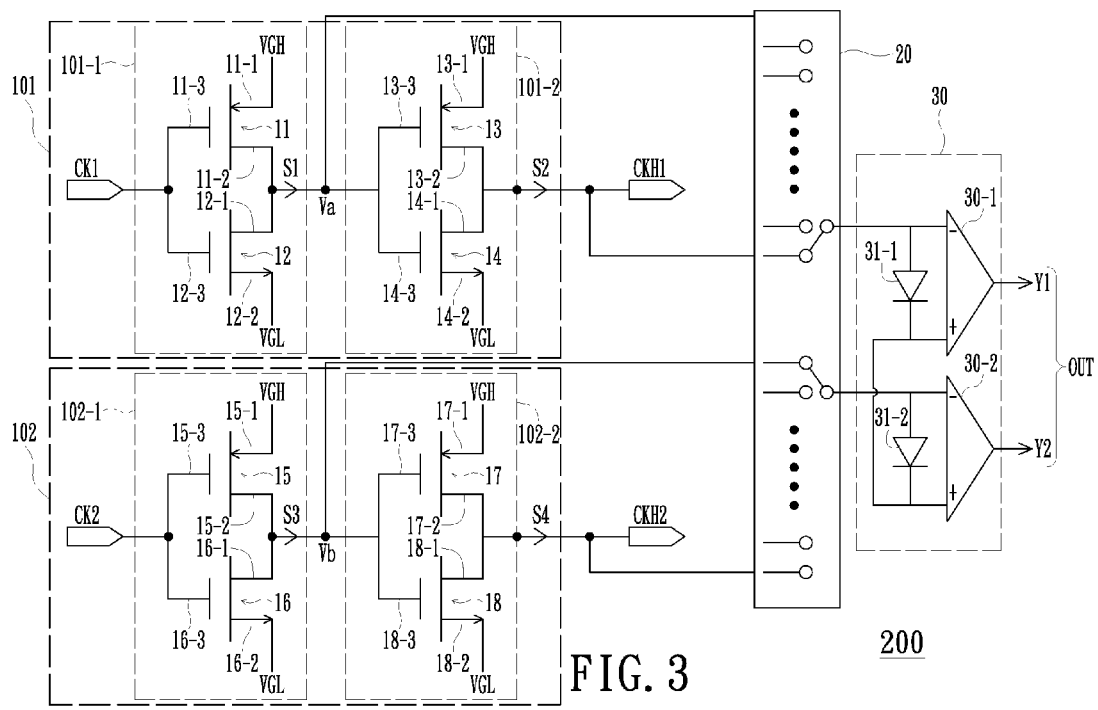
FIG. 3 is a circuit view of a level shift circuit with short-circuit protection mechanism in accordance with an embodiment of the present disclosure.

FIG. 3 is a circuit view of a level shift circuit with short-circuit protection mechanism in accordance with an embodiment of the present disclosure. Compared with the level shift circuit 100 of FIGS. 1 and 2, the level shift circuit 200 in the present embodiment of FIG. 3 further includes a switch module 20. The switch module 20 is electrically coupled between the level shift module 10 and the voltage comparing module 30. Specifically, the switch module 20 is electrically coupled to the output terminals of the front-end circuits 101-1, 102-1 and the output terminals of the inverter circuits 101-2, 102-2. The switch module 20 is configured to selectively output an output signal of one selected front-end circuit and output an output signal of one selected inverter circuit through a configuration of a plurality of switches therein. For example, the switch module 20 is configured to output either the output signal S1 or S3 when the front-end circuit 101-1 or 102-1 is selected and output the output signal S2 or S4 when the inverter circuit 101-2 or 102-2 is selected. The above-described operation of the switch module 20 is based on that the voltages of the output signals S2, S4 respectively outputted from the inverter circuits 101-2, 102-2 will be affected by a short circuit related to the output terminals CKH1, CKH2 but the voltages of the output signals S1, S3 respectively outputted from the front-end circuits 101-1, 102-2 will not be affected by this short circuit. Thus, the switch module 20 needs only to transmit one output signal from one of the plurality of front-end circuits and one output signal from one of the plurality of inverter circuits to the voltage comparing module 30; and it is determined that a short circuit happens when the voltage comparing module 30 indicates that the two received output signals have different voltages. In other words, through the adoption and configuration of the switch module 20, all the level shift units in the level shift module 10 can be sequentially detected by employing a less number of voltage comparing module 30.

In the present embodiment as shown in FIG. 3, the front-end circuit 101-1 includes a P-type transistor 11 and an N-type transistor 12. The P-type transistor 11 has a first terminal 11-1, a second terminal 11-2 and a control terminal 11-3. The N-type transistor 12 has a first terminal 12-1, a second terminal 12-2 and a control terminal 12-3. The P-type transistor 11 is configured to have its first terminal 11-1 for receiving the voltage level VGH, its second terminal 11-2 electrically coupled to an output terminal $V_a$ of the front-end circuit 101-1, and its control terminal 11-3 for receiving the clock signal CK1. The N-type transistor 12 is configured to have its first terminal 12-1 electrically coupled to the output terminal $V_a$ of the front-end circuit 101-1, its second terminal 12-2 for receiving the voltage level VGL, and its control terminal 12-3 for receiving the clock signal CK1. In another embodiment, it is understood that the front-end circuit 101-1 may be implemented with inverter circuit or inverter component with different configurations.

In the present embodiment, the inverter circuit 101-2 includes a P-type transistor 13 and an N-type transistor 14. The P-type transistor 13 has a first terminal 13-1, a second terminal 13-2 and a control terminal 13-3. The N-type transistor 14 has a first terminal 14-1, a second terminal 14-2 and a control terminal 14-3. The P-type transistor 13 is configured to have its first terminal 13-1 for receiving the voltage level VGH, its second terminal 13-2 electrically coupled to the output terminal CKH1 of the inverter circuit 101-2, and its control terminal 13-3 for receiving the output signal S1 at the output terminal $V_a$ of the front-end circuit 101-1. The N-type transistor 14 is configured to have its first terminal 14-1 electrically coupled to the output terminal CKH1 of the inverter circuit 101-2, its second terminal 14-2 for receiving the voltage level VGL, and its control terminal 14-3 for receiving the output signal S1 at the output terminal $V_a$ of the front-end circuit 101-1.

In the present embodiment as shown in FIG. 3, the front-end circuit 102-1 includes a P-type transistor 15 and an N-type transistor 16. The P-type transistor 15 has a first terminal 15-1, a second terminal 15-2 and a control terminal 15-3. The N-type transistor 16 has a first terminal 16-1, a second terminal 16-2 and a control terminal 16-3. The P-type transistor 15 is configured to have its first terminal 15-1 for receiving the voltage level VGH, its second terminal 15-2 electrically coupled to an output terminal $V_b$ of the front-end circuit 102-1, and its control terminal 15-3 for receiving the clock signal CK2. The N-type transistor 16 is configured to have its first terminal 16-1 electrically coupled to the output terminal $V_b$ of the front-end circuit 102-1, its second terminal 16-2 for receiving the voltage level VGL, and its control terminal 16-3 for receiving the clock signal CK2. In another embodiment, it is understood that the front-end circuit 102-1 may be implemented with inverter circuit or inverter component with different configurations.

In the present embodiment, the inverter circuit 102-2 includes a P-type transistor 17 and an N-type transistor 18. The P-type transistor 17 has a first terminal 17-1, a second terminal 17-2 and a control terminal 17-3. The N-type transistor 18 has a first terminal 18-1, a second terminal 18-2 and a control terminal 18-3. The P-type transistor 17 is configured to have its first terminal 17-1 for receiving the voltage level VGH, its second terminal 17-2 electrically coupled to the output terminal CKH2 of the inverter circuit 102-2, and its control terminal 17-3 for receiving the output signal S3 at the output terminal $V_b$ of the front-end circuit 102-1. The N-type transistor 18 is configured to have its first terminal 18-1 electrically coupled to the output terminal CKH2 of the inverter circuit 102-2, its second terminal 18-2 for receiving the voltage level VGL, and its control terminal 18-3 for receiving the output signal S2 at the output terminal $V_b$ of the front-end circuit 102-1.

In the present embodiment as shown in FIG. 3, the voltage comparing module 30 includes comparators 30-1, 30-2 and diodes 31-1, 31-2. The comparator 30-1 is configured to have its negative input terminal electrically coupled to the switch module 20 and from which to receive one of the two output signals provided by the switch module 20, and its positive input terminal electrically coupled to the positive input terminal of the comparator 30-2. The comparator 30-2 is configured to have its negative input terminal electrically coupled to the switch module 20 and from which to receive another one of the two output signals provided by the switch module 20, and its positive input terminal electrically coupled to the positive input terminal of the comparator 30-1. The diode 31-1 is configured to have its anode electrically coupled to the negative input terminal of the comparator 30-1 and its cathode electrically coupled to the positive input terminal of the comparator 30-1. The diode 31-2 is configured to have its anode electrically coupled to the negative input terminal of the comparator 30-2 and its cathode electrically coupled to the positive input terminal of the comparator 30-2. The output signal Y1 of the comparator 30-1 and the output signal Y2 of the comparator 30-2 corporately form the short-circuit protection trigger signal OUT. In addition, both of the comparators 30-1, 30-2 may be further electrically coupled to an operation voltage (not sown) having a voltage level VGH or zero.

In summary, the switch module 20 in the present embodiment is configured to selectively output the output signal of the front-end circuit in one specific out of the plurality of level shift units and the output signal of the inverter circuit in another level shift unit (for example, the level shift unit one stage before or after the aforementioned specific level shift unit). Therefore, through the aforementioned configuration of the switch module 20, only one signal voltage comparing module 30 is needed; in other words, the short-circuit issue can be fully detected without disposing a voltage comparing module 30 for each two adjacent level shift units.

Figures 1, 4:
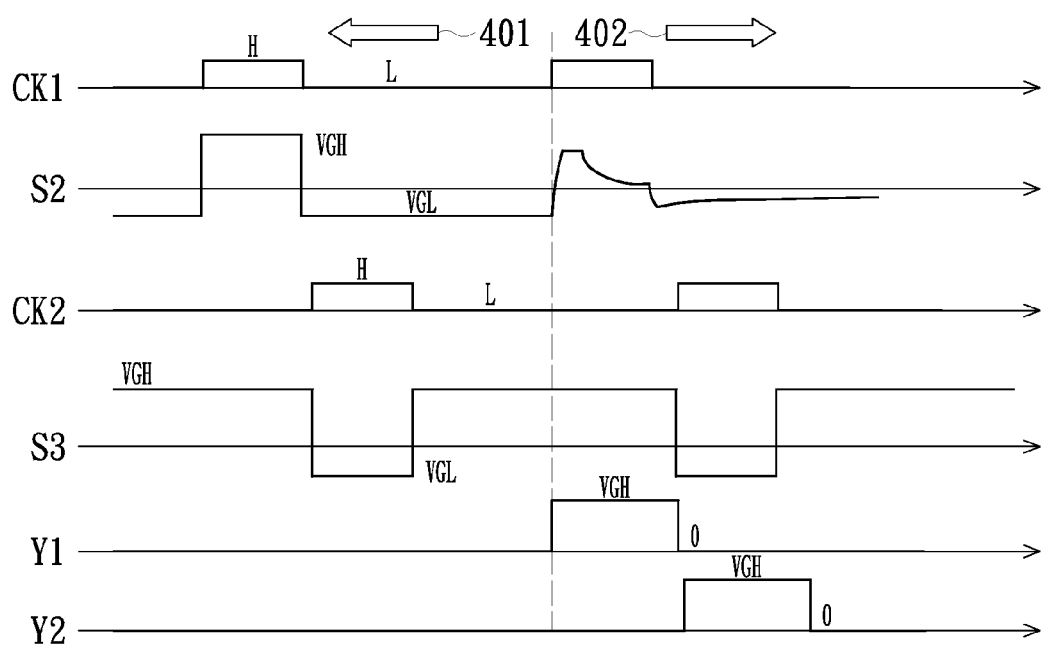
Figures 2, 4:
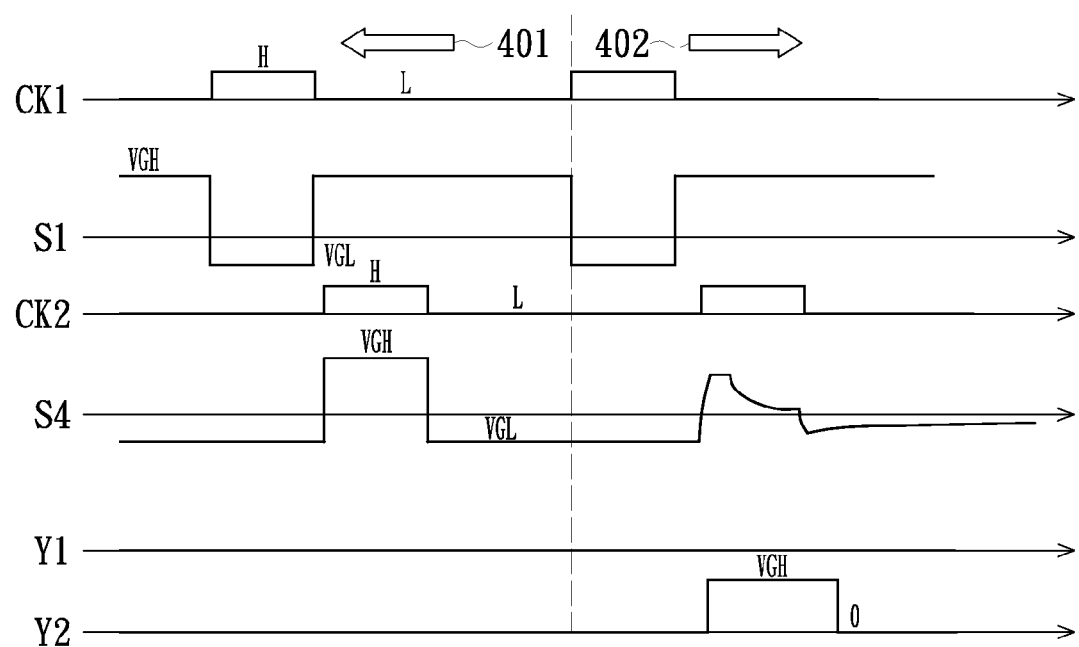

FIG. 4-1 is a timing chart of the signals related to the level shift circuit 200 of FIG. 3 in accordance with an embodiment of the present disclosure. Specifically, the arrow 401 in FIG. 4-1 indicates the timing with no short circuit occurring and the arrow 402 indicates the timing with a short circuit occurring. In addition, the output signals S2, S3 in FIG. 4-1 are selected to be inputted to the negative input terminals of the comparators 30-1, 30-2 as illustrated in FIG. 3, respectively. In addition, the clock signals CK1, CK2 are configured to have either a high voltage level H or a low voltage level L. Please refer to FIGS. 3 and 4-1 together. In one embodiment, the switch module 20 is configured to select the output signals S2, S3 to output to the voltage comparing module 30 for voltage comparison when the clock signal CK1 has a high voltage level H. As described above, the output signals S2, S3 have different voltages when there exists a short circuit between the level shift unit 101 and the gate driver circuit (not shown); and correspondingly, the voltage comparing module 30 is configured to generate an output signal Y1 being as the short-circuit protection trigger signal OUT.

Similarly, in another embodiment, the switch module 20 is configured to select the output signals S2, S3 to output to the voltage comparing module 30 for voltage comparison when the clock signal CK2 has a high voltage level H. As described above, the output signals S2, S3 have different voltages when there exists a short circuit between the level shift unit 101 and the gate driver circuit (not shown); and correspondingly, the voltage comparing module 30 is configured to generate an output signal Y2 being as the short-circuit protection trigger signal OUT. In still another embodiment, it is understood that the switch module 20 is configured to select the output signals S2, S3 to output to the voltage comparing module 30 for voltage comparison when the clock signals CK1, CK2 sequentially have a high voltage level H. As a result, the short-circuit protection trigger signal OUT is formed by at least one of the output signals Y1, Y2; and through repeatedly using the output signals Y1, Y2, whether there existing a short circuit can be determined. For example, it is determined that there is a short circuit when the short-circuit protection trigger signal OUT has a high voltage level. Additionally, in the aforementioned three embodiment, it is to be noted that the output signal S2 is selected from the inverter circuit (for example, the inverter circuit 101-2) in one specific level shift unit (for example, the level shift unit 101) and the output signal S3 is selected from the front-end circuit (for example, the front-end circuit 102-1) in the level shift unit one stage next to the specific level shift unit (for example, the level shift unit 102).

FIG. 4-2 is a timing chart of the signals related to the level shift circuit 200 of FIG. 3 in accordance with another embodiment of the present disclosure. Specifically, the arrow 401 in FIG. 4-2 indicates the timing with no short circuit occurring and the arrow 402 indicates the timing with a short circuit occurring. In addition, the output signals S1, S4 in FIG. 4-2 are selected to be inputted to the negative input terminals of the comparators 30-1, 30-2, respectively. In addition, the clock signals CK1, CK2 are configured to have either a high voltage level H or a low voltage level L. Please refer to FIGS. 3 and 4-2 together. In one embodiment, the switch module 20 is configured to select the output signals S1, S4 to output to the voltage comparing module 30 for voltage comparison when the clock signal CK1 has a high voltage level H. As described above, the output signals S1, S4 have different voltages when there exists a short circuit between the level shift unit 102 and the gate driver circuit (not shown); and correspondingly, the voltage comparing module 30 is configured to generate the output signal Y2 being as the short-circuit protection trigger signal OUT; wherein the short-circuit protection trigger signal OUT has, for example, a high voltage level. In summary, it is to be noted that the output signal S4 of the inverter circuit 102-1 in the level shift unit 102 and the output signal S1 of the front-end circuit 101-1 in the in the level shift unit one stage before the level shift unit 102 (that is, the level shift unit 101) are selected for voltage comparison.

Please refer to FIGS. 3 and 4-1 together, again. The switch module 20 is configured to select the output signals S2, S3 to output to the voltage comparing module 30 for voltage comparison when the clock signal CK1 has a high voltage level H; wherein the output signal S2 is selected from the inverter circuit 101-2 in the level shift unit 101 and the output signal S3 is selected from the front-end circuit 102-1 in the level shift unit 102. Therefore, once the high voltage level of the output signal S2 of the inverter circuit 101-2 is affected by a short circuit thereby being lower than the high voltage level of the output signal S3, the voltage level at the negative input terminal of the comparator 30-2 is higher than that at the positive input terminal of the comparator 30-2, and accordingly the diode bias 31-2 is forward biased and is conductive. Consequentially, the output signal Y2 of the comparator 30-2 has a zero voltage level. Meanwhile, the voltage level at the negative input terminal of the comparator 30-1 is lower than that at the positive input terminal of the comparator 30-1, and the diode bias 31-1 is reverse biased and is cut-off. Consequentially, the output signal Y1 of the comparator 30-1 has a voltage level VGH. It is understood that the comparators 30-1, 30-2 may generate output signals only when the voltage difference between the positive input terminal and the negative input terminal thereof reaches to a threshold (generally, the threshold is the input offset of comparator). Therefore, because both of the conductive voltages of the diodes 31-1, 31-2 are smaller than the aforementioned threshold, the output signal Y2 of the comparator 30-2 has a zero voltage level. As a result, the output signal Y1 herein is referred to as the short-circuit protection trigger signal OUT for the rear-end circuit.

Similarly, as illustrated in FIGS. 3 and 4-1, the switch module 20 is configured to select the output signals S2, S3 to output to the voltage comparing module 30 for voltage comparison when the clock signal CK2 has a high voltage level H. Accordingly, the output signal Y2, generated by the voltage comparing module 30 and having a voltage level VGH, is referred to as the short-circuit protection trigger signal OUT for the rear-end circuit; and no redundant detail is to be given herein.

Please refer to FIGS. 3 and 4-2 together, again. The switch module 20 is configured to select the output signals S4, S1 to output to the voltage comparing module 30 for voltage comparison when the clock signal CK2 has a high voltage level H; wherein the output signal S4 is selected from the inverter circuit 102-2 in the level shift unit 102 and the output signal S1 is selected from the front-end circuit 101-1 in the level shift unit 101. Therefore, once the high voltage level of the output signal S4 of the inverter circuit 102-2 is affected by a short circuit thereby being lower than the high voltage level of the output signal S1, the voltage level at the negative input terminal of the comparator 30-1 is higher than that at the positive input terminal of the comparator 30-1, and accordingly the diode bias 31-1 is forward biased and is conductive. In addition, because the conductive voltage of the diode 31-1 is smaller than the aforementioned threshold, the output signal Y1 of the comparator 30-1 has a zero voltage level. Meanwhile, the voltage level at the negative input terminal of the comparator 30-2 is lower than that at the positive input terminal of the comparator 30-2, and the diode bias 31-2 is reverse biased and is cut-off. Consequentially, the output signal Y2 of the comparator 30-2 has a voltage level VGH. As a result, the output signal Y2 herein is referred to as the short-circuit protection trigger signal OUT for the rear-end circuit.

In addition, in response to a specific display requirement (for example, a three-dimensional (3D) display), the level shift unit 102 is at least two stages after the level shift unit 101 or at least two stages before the level shift unit 101 due to one clock signal is supplied to two adjacent level shift units, as described above.

In one embodiment, it is to be noted that the voltage comparing module 30 in FIG. 3 may be directly electrically coupled to the level shift units 101, 102, for signal comparison.

Figure 5:
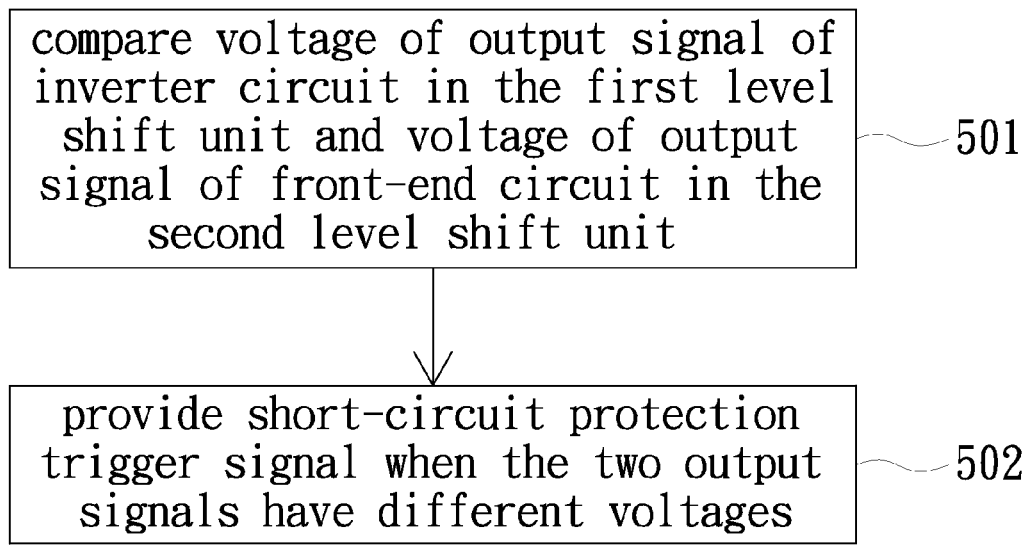
FIG. 5 is a flow char of a short-circuit detection method in accordance with an embodiment of the present disclosure.

In accordance with the above-described embodiments, a short-circuit detection method applied to the aforementioned level shift circuit can be summarized by those ordinarily skilled in the art. FIG. 5 is a flow char of a short-circuit detection method in accordance with an embodiment of the present disclosure; wherein the short-circuit detection method may be executed by the apparatuses disclosed in each above-described embodiment. As shown, the short-circuit detection method in the present embodiment includes steps of: comparing the voltage of the output signal of the inverter circuit in the first level shift unit and the voltage of the output signal of the front-end circuit in the second level shift unit (step 501); and providing the short-circuit protection trigger signal when the two output signals have different voltages (step 502).

In summary, through comparing the voltage of the output signal of the inverter circuit in the first level shift unit and the voltage of the output signal of the front-end circuit in the second level shift unit, the level shift circuit of the present disclosure can determine that there is a short-circuit issue when the two output signals have different voltages and correspondingly issue a short-circuit protection trigger signal to a specific circuit in a rear-end circuit, thereby achieving the short-circuit protection purpose.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A level shift circuit with short-circuit detection mechanism, comprising:
   a level shift module, comprising a plurality of stages of level shift units, each level shift unit comprising a front-end circuit and an inverter circuit, wherein each inverter circuit is electrically coupled to the respective front-end circuit and configured to receive and invert an output signal of the respective front-end circuit, each front-end circuit is configured to receive a respective clock signal, convert a high voltage level and a low voltage level of the received respective clock signal into a first voltage level and a second voltage level, respectively, and output a converted clock signal with the first voltage level and the second voltage level according to the respective clock signal; and
   a voltage comparing module, electrically coupled to the level shift module and configured to receive an output signal of the inverter circuit in a first level shift unit among the plurality of level shift units and an output signal of the front-end circuit of a second level shift unit among the plurality of level shift units and compare the two received output signals, wherein the voltage comparing module is further configured to output a short-circuit protection trigger signal when the two received output signals have substantially different voltages.

2. The level shift circuit according to claim 1, wherein the second level shift unit is one stage after the first level shift unit or one stage before the first level shift unit.

3. The level shift circuit according to claim 2, further comprising a switch module, wherein the switch module is electrically coupled to output terminals of the plurality of front-end circuits and output terminals of the plurality of inverter circuits, the switch module is configured to selectively output the output signal of one of the plurality of front-end circuits and the output signal of one of the plurality of inverter circuits.

4. The level shift circuit according to claim 2, wherein the voltage comparing module comprises a first comparator, a second comparator, a first diode and a second diode, the first comparator is configured to have its negative input terminal electrically coupled to the level shift module to receive the output signal of the inverter circuit in the first level shift unit and to have its positive input terminal electrically coupled to a positive input terminal of the second comparator, the second comparator is configured to have its negative input terminal electrically coupled to the level shift module to receive the output signal of the front-end circuit in the second level shift unit and to have its positive input terminal electrically coupled to the positive input terminal of the first comparator, the first diode is configured to have its anode electrically coupled to the negative input terminal of the first comparator and to have its cathode electrically coupled to the positive input terminal of the first comparator, the second diode is configured to have its anode electrically coupled to the negative input terminal of the second comparator and to have its cathode electrically coupled to the positive input terminal of the second comparator, an output signal of the first comparator and an output signal of the second comparator corporately form the short-circuit protection trigger signal.

5. The level shift circuit according to claim 2, wherein each front-end circuit comprises a P-type transistor and an N-type transistor, the P-type transistor has a first terminal, a second terminal and a first control terminal, the N-type transistor has a third terminal, a fourth terminal and a second control terminal, the P-type transistor is configured to have its first terminal for receiving a first voltage having the first voltage level, its second terminal electrically coupled to the third terminal of the N-type transistor and referred to as an output terminal of the respective front-end circuit, and its first control terminal for receiving the respective clock signal, the N-type transistor is configured to have its third terminal electrically coupled to the second terminal of the P-type transistor, its fourth terminal for receiving a second voltage having the second voltage level, and its second control terminal for receiving the respective clock signal.

6. The level shift circuit according to claim 2, wherein each one inverter circuit comprises a P-type transistor and an N-type transistor, the P-type transistor has a first terminal, a second terminal and a first control terminal, the N-type transistor has a third terminal, a fourth terminal and a second control terminal, the P-type transistor is configured to have its first terminal for receiving a first voltage having the first voltage level, its second terminal electrically coupled to the third terminal of the N-type transistor and referred to as an output terminal of the inverter circuit, and its first control terminal for receiving the output signal of the respective front-end circuit, the N-type transistor is configured to have its third terminal electrically coupled to the second terminal of the P-type transistor, its fourth terminal for receiving a second voltage having the second voltage level, and its second control terminal for receiving the output signal of the respective front-end circuit.

7. The level shift circuit according to claim 1, wherein the second level shift unit is at least two stages after the first level shift unit or at least two stages before the first level shift unit.

8. The level shift circuit according to claim 7, further comprising a switch module, wherein the switch module is electrically coupled to output terminals of the plurality of front-end circuits and output terminals of the plurality of inverter circuits, the switch module is configured to selectively output the output signal of one of the plurality of front-end circuits and the output signal of one of the plurality of inverter circuits.

9. The level shift circuit according to claim 7, wherein the voltage comparing module comprises a first comparator, a second comparator, a first diode and a second diode, the first comparator is configured to have its negative input terminal electrically coupled to the level shift module to receive the output signal of the inverter circuit in the first level shift unit and to have its positive input terminal electrically coupled to a positive input terminal of the second comparator, the second comparator is configured to have its negative input terminal electrically coupled to the level shift module to receive the output signal of the front-end circuit in the second level shift unit and to have its positive input terminal electrically coupled to the positive input terminal of the first comparator, the first diode is configured to have its anode electrically coupled to the negative input terminal of the first comparator and to have its cathode electrically coupled to the positive input terminal of the first comparator, the second diode is configured to have its anode electrically coupled to the negative input terminal of the second comparator and to have its cathode electrically coupled to the positive input terminal of the second comparator, an output signal of the first comparator and an output signal of the second comparator corporately form the short-circuit protection trigger signal.

10. The level shift circuit according to claim 7, wherein each front-end circuit comprises a P-type transistor and an N-type transistor, the P-type transistor has a first terminal, a second terminal and a first control terminal, the N-type transistor has a third terminal, a fourth terminal and a second control terminal, the P-type transistor is configured to have its first terminal for receiving a first voltage having the first voltage level, its second terminal electrically coupled to the third terminal of the N-type transistor and referred to as an output terminal of the respective front-end circuit, and its first control terminal for receiving the respective clock signal, the N-type transistor is configured to have its third terminal electrically coupled to the second terminal of the P-type transistor, its fourth terminal for receiving a second voltage having the second voltage level, and its second control terminal for receiving the respective clock signal.

11. The level shift circuit according to claim 7, wherein each one inverter circuit comprises a P-type transistor and an N-type transistor, the P-type transistor has a first terminal, a second terminal and a first control terminal, the N-type transistor has a third terminal, a fourth terminal and a second control terminal, the P-type transistor is configured to have its first terminal for receiving a first voltage having the first voltage level, its second terminal electrically coupled to the third terminal of the N-type transistor and referred to as an output terminal of the inverter circuit, and its first control terminal for receiving the output signal of the respective front-end circuit, the N-type transistor is configured to have its third terminal electrically coupled to the second terminal of the P-type transistor, its fourth terminal for receiving a second voltage having the second voltage level, and its second control terminal for receiving the output signal of the respective front-end circuit.

12. The level shift circuit according to claim 1, further comprising a switch module, wherein the switch module is electrically coupled to output terminals of the plurality of front-end circuits and output terminals of the plurality of inverter circuits, the switch module is configured to selectively output the output signal of one of the plurality of front-end circuits and the output signal of one of the plurality of inverter circuits.

13. The level shift circuit according to claim 1, wherein the voltage comparing module comprises a first comparator, a second comparator, a first diode and a second diode, the first comparator is configured to have its negative input terminal electrically coupled to the level shift module to receive the output signal of the inverter circuit in the first level shift unit and to have its positive input terminal electrically coupled to a positive input terminal of the second comparator, the second comparator is configured to have its negative input terminal electrically coupled to the level shift module to receive the output signal of the front-end circuit in the second level shift unit and to have its positive input terminal electrically coupled to the positive input terminal of the first comparator, the first diode is configured to have its anode electrically coupled to the negative input terminal of the first comparator and to have its cathode electrically coupled to the positive input terminal of the first comparator, the second diode is configured to have its anode electrically coupled to the negative input terminal of the second comparator and to have its cathode electrically coupled to the positive input terminal of the second comparator, an output signal of the first comparator and an output signal of the second comparator corporately form the short-circuit protection trigger signal.

14. The level shift circuit according to claim 1, wherein each front-end circuit comprises a P-type transistor and an N-type transistor, the P-type transistor has a first terminal, a second terminal and a first control terminal, the N-type transistor has a third terminal, a fourth terminal and a second control terminal, the P-type transistor is configured to have its first terminal for receiving a first voltage having the first voltage level, its second terminal electrically coupled to the third terminal of the N-type transistor and referred to as an output terminal of the respective front-end circuit, and its first control terminal for receiving the respective clock signal, the N-type transistor is configured to have its third terminal electrically coupled to the second terminal of the P-type transistor, its fourth terminal for receiving a second voltage having the second voltage level, and its second control terminal for receiving the respective clock signal.

15. The level shift circuit according to claim 1, wherein each one inverter circuit comprises a P-type transistor and an N-type transistor, the P-type transistor has a first terminal, a second terminal and a first control terminal, the N-type transistor has a third terminal, a fourth terminal and a second control terminal, the P-type transistor is configured to have its first terminal for receiving a first voltage having the first voltage level, its second terminal electrically coupled to the third terminal of the N-type transistor and referred to as an output terminal of the inverter circuit, and its first control terminal for receiving the output signal of the respective front-end circuit, the N-type transistor is configured to have its third terminal electrically coupled to the second terminal of the P-type transistor, its fourth terminal for receiving a second voltage having the second voltage level, and its second control terminal for receiving the output signal of the respective front-end circuit.

16. A short-circuit detection method adapted to be used in a display apparatus comprising a level shift module, the level shift module comprising a plurality of stages of level shift units, each level shift unit comprising a front-end circuit and an inverter circuit, each inverter circuit being electrically coupled to the respective front-end circuit and configured to receive and invert an output signal of the respective front-end circuit, each front-end circuit being configured to receive a respective clock signal, convert a high voltage level and a low voltage level of the received respective clock signal into a first voltage level and a second voltage level, respectively, and output a converted clock signal with the first voltage level and the second voltage level according to the respective clock signal, the short-circuit detection method comprising:
 comparing a voltage of the output signal of the inverter circuit in a first level shift unit in the plurality of level shift units and a voltage of the output signal of the front-end circuit in a second level shift unit in the plurality of level shift units; and
 providing a short-circuit protection trigger signal when it is determined that the two output signals have substantially different voltages.

17. The short-circuit detection method according to claim 16, wherein the second level shift unit is one stage after the first level shift unit or one stage before the first level shift unit.

18. The short-circuit detection method according to claim 16, wherein the second level shift unit is at least two stages after the first level shift unit or at least two stages before the first level shift unit.

* * * * *